United States Patent [19]

Cossins

[11] Patent Number: 5,268,601
[45] Date of Patent: Dec. 7, 1993

[54] LOGARITHMIC AMPLIFIER CIRCUIT WITH TEMPERATURE COMPENSATION

[75] Inventor: Peter A. Cossins, East Wood, Nr. Newbury, England

[73] Assignee: Quantel Limited, Newbury, England

[21] Appl. No.: 525,744

[22] Filed: May 18, 1990

[30] Foreign Application Priority Data

May 19, 1989 [GB] United Kingdom ............... 8911573

[51] Int. Cl.⁵ .................... H03F 1/30; G06G 7/10
[52] U.S. Cl. .................. 307/491; 307/492; 307/310; 328/145; 330/289
[58] Field of Search ............ 328/145; 307/492, 310, 307/491, 524, 522; 455/127, 226; 374/172; 330/289; 331/176; 341/119

[56] References Cited

U.S. PATENT DOCUMENTS

| 3,479,593 | 11/1969 | Dissing et al. | 328/145 |
| 3,987,342 | 10/1976 | Bird et al. | 330/289 |
| 3,992,622 | 11/1976 | Numata et al. | 328/145 |
| 4,019,150 | 4/1977 | Lurey et al. | 455/117 |
| 4,237,420 | 12/1980 | Ebihara et al. | 307/310 |
| 4,469,082 | 9/1984 | Nishitoba et al. | 307/310 |
| 4,555,675 | 11/1985 | Blanchadin et al. | 330/289 |
| 4,611,181 | 9/1986 | Fukumura et al. | 331/176 |
| 4,617,522 | 10/1986 | Tarbutton et al. | 330/289 |
| 4,698,655 | 10/1987 | Schultz | 307/310 |
| 4,712,078 | 12/1987 | Slobodnik et al. | 331/176 |
| 4,774,564 | 9/1988 | Konishi | 358/29 |
| 4,791,380 | 12/1988 | Chiappetta | 307/310 |
| 4,924,112 | 5/1990 | Anderson et al. | 307/310 |
| 4,939,786 | 7/1990 | McCallum et al. | 455/127 |

FOREIGN PATENT DOCUMENTS

| 2482381 | 5/1980 | European Pat. Off. . |
| 840950 | 6/1981 | European Pat. Off. . |
| 173907 | 9/1985 | Japan . |
| 155908 | 6/1988 | Japan . |
| 51904 | 2/1990 | Japan . |
| 2110896 | 12/1982 | United Kingdom . |

OTHER PUBLICATIONS

"Logarithmic Amplication" by Richard Smith Hughes, published by Artech House Incorporated, pp. 74-89.

Primary Examiner—William L. Sikes
Assistant Examiner—Toan Tran
Attorney, Agent, or Firm—Cooper & Dunham

[57] ABSTRACT

An amplification circuit comprises a detector (15) for detecting transmitted radio signals in the range 0.5 GHz to 20 GHz and a wideband logarithmic video amplifier (WLVA 16). The WLVA is fabricated on an application specific integrated circuit (17) for example with a temperature sensor (20). The output from the temperature sensor is supplied to a second ASIC (24) which samples the temperature signal and supplies compensation signals read from a non-volatile memory device.

8 Claims, 3 Drawing Sheets

LOGARITHMIC AMPLIFIER CIRCUIT WITH TEMPERATURE COMPENSATION

FIELD OF THE INVENTION

The present invention relates to an amplification circuit and in particular to logarithmic video amplifiers for example which, in addition to the actual amplifier, include a radio signal detector and means for compensating the amplifier for variations in operating temperature.

BACKGROUND OF THE INVENTION

Logarithmic video amplifiers are described by Richard Smith Hughes in his book "Logarithmic Amplification" published by Artech House Incorporated and given the International Standard Book Number 0-89006-182-3. An important application for logarithmic video amplifiers, as identified by Hughes, is that of direction finding, in which a plurality of antennas are mounted onto, say, an aircraft and the position of a radio source, such as a radar transmitter, is determined by comparing the strength of signals received by the antennas. Thus, it is important that all the amplifying circuits exhibit very similar responses to ensure that a processor, arranged to calculate position, receives reliable data.

Radio signals from radar transmitters often consist of pulse modulated carrier waves having a frequency up to 20 GHz, yielding baseband signals (after detection) of up to several hundred MHz. Signals occupying this band may be identified as "video" and relatively fast circuits are required to amplify signals of this type. Devices of this type with particularly wide bandwidths are also identified as wideband logarithmic video amplifiers (WLVA).

A common problem with electronic circuits, and particularly those working with analogue signals, is that their operating characteristics tend to change with variations in operating temperature. This problem is particularly relevant to WLVA's when used in direction finding equipment, because different circuits may be operating at different temperatures and different circuits (although constructed using similar techniques) may behave differently when operating at the same temperature. Techniques are known for compensating for temperature but these are complicated in logarithmic amplifiers which include many amplification stages, as described by Hughes. Temperature dependency becomes even more relevant in video amplifiers which operate right down to dc and are hence dc coupled. As identified at page 74 of Hughes, dc output will drift with temperature at each amplification stage. Page 86 of Hughes goes on to say that each linear amplifier stage may have to be tested over temperature and then set for the best voltage offset, which is identified as being time consuming and costly. Thus, with conventional designs, the designer is often faced with trade-off between operational bandwidth and temperature stability.

SUMMARY OF THE INVENTION

According to one aspect of the present invention, there is provided an amplification circuit comprising detecting means for detecting transmitted radio signals having a frequency in the range 0.5 GHz to 20 GHz, a wideband amplifier for amplifying said detected signals, and temperature compensation means wherein said temperature compensation means includes a temperature sensor arranged to produce a temperature signal indicative of the temperature of said amplifier, sampling means for sampling said temperature signal, means for storing compensation parameters and processing means for supplying a plurality of compensation signals to said amplifier.

According to another aspect of the invention there is provided an amplification system comprising a logarithmic amplifier and a temperature sensor integrated on the same fabrication, and a calibration circuit for sampling signals from the temperature sensor and for generating in response to the sampled signals compensation data to define parameters which control operation of the amplifier.

The above and further features of the invention are set forth with particularly in the appended claims and together with advantages thereof will become clearer from consideration of the following detailed description of an exemplary embodiment of the invention given with reference to the accompanying drawings.

DESCRIPTION OF A PREFERRED EMBODIMENTS

Figure 1:
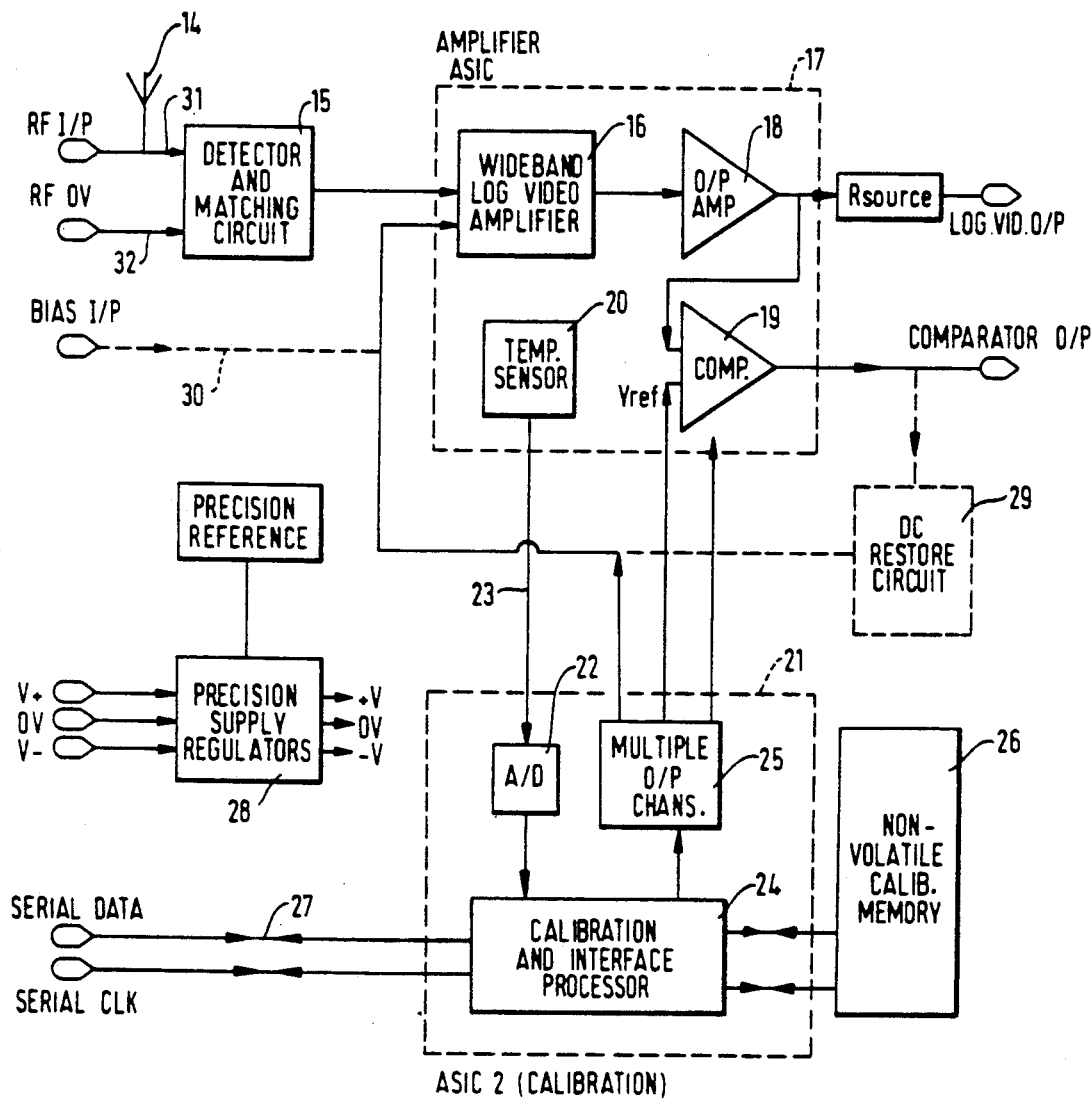
FIG. 1 is a schematic circuit diagram of an amplifier circuit embodying the invention.

An amplification circuit for use in a radio source direction system is shown in FIG. 1 of the accompanying drawings. Radio signals in the range 0.5 GHz to 20 GHz, emanating from a remote radar transmitter, are received by an antenna 14 and supplied to a detector and matching circuit 15. A video signal output from detector 15 is amplified by a wideband logarithmic video amplifier (WLVA) 16 to produce an output voltage proportional to the power of the incoming signal, which may be calibrated in decibels. The WLVA is constructed on a single chip, identified herein as an application specific integrated circuit (ASIC) 17 fabricated using bi-polar technology to provide the necessary bandwidth and speed of operation.

In addition to the wideband amplifier 16, the amplifier ASIC 17 also includes an output amplifier 18, a comparator 19, and a temperature sensor 20. The temperature sensor 20 is of conventional design, in which the resistance of a transistor, or a similar element, varies with temperature to provide an analogue temperature signal. Temperature measurement of amplifying circuits is known per se but fabricating the sensor 20 onto the same ASIC as the amplifier provides two significant advantages. Firstly, the amplifying circuits and the sensor are physically very close together so that the temperature of the sensor (being the actual property being measured) will follow the temperature of the amplifying circuits very precisely. Secondly, the sensor is constructed of similar material to that of the amplifying circuit and therefore its temperature characteristics will be similar to those of the amplifying components. This second advantage is not as significant as the first in the present embodiment, because problems associated with component differences can in any case be resolved by the compensation technique to be described in detail hereinafter. However, it does remove an unnecessary burden from the compensation circuits thereby allowing them to provide compensation over a wider temperature range for the same processing power and memory capacity.

Using conventional techniques, the ASIC 17 could include circuits for compensating the WLVA 16 in response to the temperature signal produced by the sensor 20. However, the scale of this problem is not apparent until the nature of the WLVA circuits is actually considered. The WLVA is used to compress the dynamic range of the signal to facilitate digital processing and the logarithmic amplification is therefore itself an essentially analogue process. Simple analogue components which produce an output voltage proportional to the logarithm of the input power over a significant range and with the required bandwidth are not available so far as applicant aware and a more sophisticated approach is therefore required.

Figure 2:
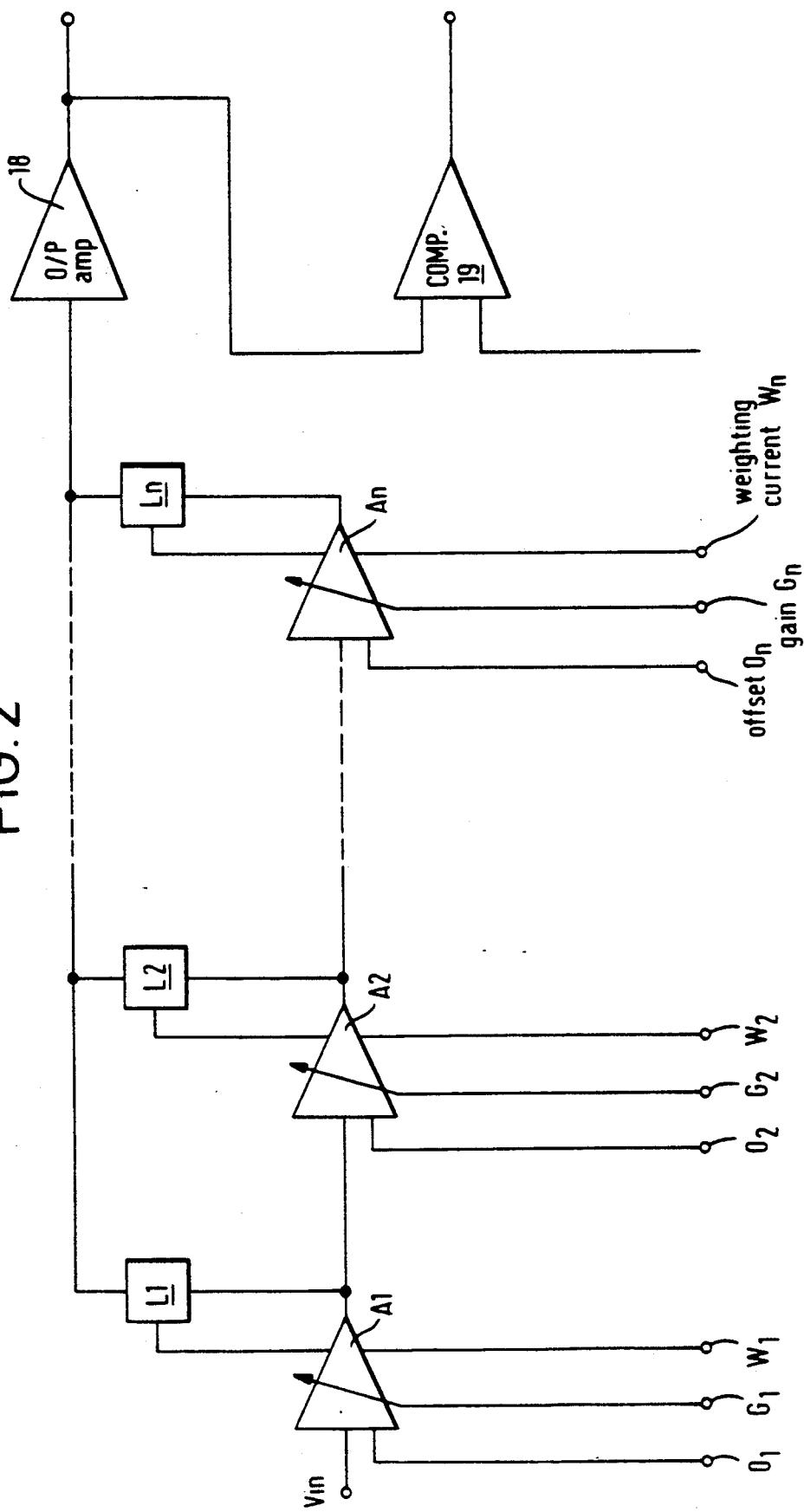
FIG. 2 is a schematic circuit diagram of a wideband logarithmic video amplifier used in the circuit of FIG. 1.

The WLVA 16 is shown in greater detail in FIG. 2 of the accompanying drawings and consists of a plurality of amplification stages (1 to n) in which each stage has a linear amplifier A and a logarithmic response circuit L. Each logarithmic circuit L produces substantially no usable output current until an input voltage reaches a predetermined threshold; it then behaves logarithmically over a small range and then saturates so that, as input voltage increases further, the output current remains the same. The outputs from the logarithmic circuits are added and supplied to an output amplifier 18 producing an output voltage which is proportional to the logarithm of the input voltage from the detector 15.

In the circuit shown in FIG. 2, an input voltage Vin is supplied to cascaded linear amplifiers A1, A2 .... An wherein the output from each linear amplifier is greater than that of the previous stage by a predetermined factor. In operation, the first logarithmic circuit which will produce an output, as input voltage is increased from zero, is the circuit Ln. As Ln saturates, Ln-1 will start to produce an output which in turn as it saturates will hand over to the next stage in the chain and so on until contributions are made by all of the logarithmic circuits, including the circuit L1. As will be appreciated, a smooth logarithmic response is only possible if all the stages match up with their neighbours and this is achieved by adjusting the gain (G) of each amplifier, the dc offset (0) supplied to each amplifier and the weighting current (W) supplied to each logarithmic stage, which are herein collectively termed control signals. A typical logarithmic amplifier may have six stages giving a total of eighteen variable control signals. Thus, the problem facing the circuit designer, when compensating the circuit for temperature variation, is that a significant number of the control signals may require adjusting in response to temperature variation.

The problem of temperature compensation can however be solved by taking advantage of the fact that temperature variations tend to occur relatively slowly, particularly when compared to the high speed capabilities of the bi-polar circuits. To this end, the circuit of FIG. 1 includes a second compensating or calibrating ASIC 21, fabricated using combined analogue and digital CMOS technology, in preference to providing analogue compensating circuits in the bipolar ASIC 17. Temperature variations are relatively slow and this allows the output from the temperature sensor 20 to be sampled and digitised. The compensation ASIC 21 therefore includes an analogue to digital converter 22 arranged to receive the analogue temperature signal from the temperature sensor 20 over a line 23. The compensation ASIC 21 comprises a calibration and interface processor 24, having similar processing power to a conventional 8 bit microprocessor and an output circuit 25, for supplying parallel outputs to the amplifier ASIC 17. In this embodiment, the calibration ASIC 21 supplies reference signals to the wideband logarithmic amplifier 16 and to the comparator 19, together with twelve temperature compensation signals supplied to various parts within the amplifier ASIC 17.

The calibration and interface processor is arranged to respond to increments in temperature of approximately one and a half degrees for example and for each temperature increment a set of calibration parameters are read from a non volatile memory device 26. The processor 24 uses data supplied from the calibration memory 26 to load the output circuit 25 with the necessary data, which is then supplied continuously to the amplifier ASIC 17 in analogue form. A typical operating temperature range is minus forty to plus one hundred degrees celsius and therefore, the memory device 26 must be arranged to provide storage for about one hundred temperature values for each of its, in this example, twelve temperature compensating outputs.

The way in which the performance of a WLVA, of the type shown in FIG. 2, varies with temperature will depend on many factors and two, apparently identical, circuits produced from the same production run may have significant differences which affect their performance in applications such as direction finding. Each circuit is therefore individually calibrated and then loaded with its own unique set of calibration values during production.

Before this production calibration can be performed an initial design calibration is also required to determine which values will actually require compensation in the final product. In a six stage circuit, there are eighteen potential calibration points, 0, G and W for each stage. However, in practice not all of these require temperature compensation. Design calibration therefore involves the designer determining which of the eighteen parameters are most sensitive to temperature changes and selecting those parameters as the parameters that will require adjustment during production calibration.

The calibration ASIC 24 of FIG. 1 provides, as previously stated, twelve calibration signals which are sufficient for most six stage amplifiers and this provides a vast improvement over existing production calibration techniques. Furthermore, in certain circumstances some of the parameters may be very sensitive to temperature in which case two of the outputs from the calibration ASIC can be used for the same control value, giving coarse and fine control and thereby effectively extending the control from eight bit resolution to sixteen bit resolution.

Thus, after design calibration, the designer can determine which of the available calibration points 0, G and W for each amplifier require temperature compensation and can then configure the connections between the amplifier ASIC 17 and the calibration ASIC 21 accordingly.

Production calibration consists of calculating calibration parameters (100×12 8 bit values) individually for each device produced. In conventional circuits, calibration of this type would be very expensive and time consuming. Thus, not only would a designer be losing bandwidth by introducing temperature compensation but he would also incur high calibration costs. The approach hitherto has therefore been to concentrate on design calibration, which is done only once for a design, in order to minimise production calibration. In the circuit shown in FIG. 1, production calibration may be easily automated to reduce significantly component cost. Thus, the circuit is subject to each of its one hundred operating temperatures while a computer program calculates the optimum combination of compensation signals for each temperature. The values of these signals are then loaded to the calibration memory device 26 and this results in a fully programmed device.

Circuits can never exhibit absolutely perfect characteristics and, in placing calibration under the control of a computer program, imperfections in that program will affect the response of the component. However, an important feature of the disclosed circuit is that components will have very consistent characteristics because hardware discrepancies are compensated by the stored numbers. Thus, in direction finding equipment for example, where a plurality of devices are used in a system, all the circuits should behave in very similar ways so that inaccuracies will cancel out to give a very accurate overall performance.

Figure 4:
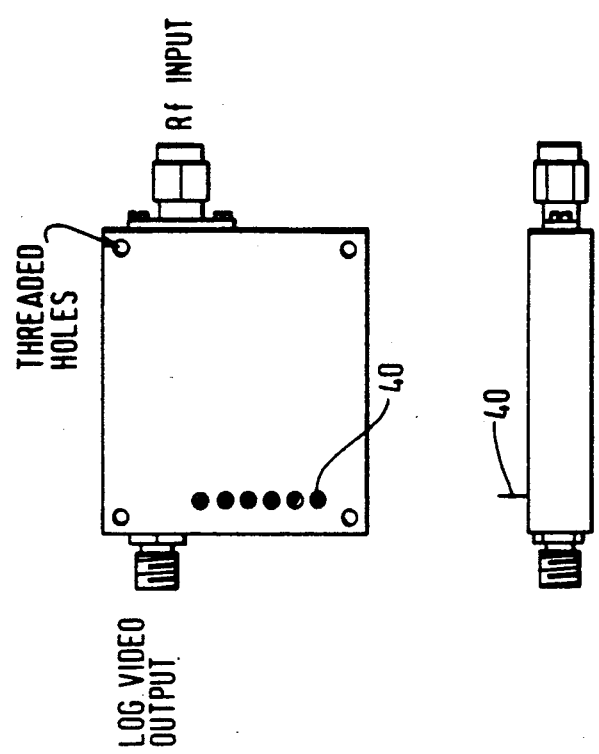
FIG. 4 shows a plurality of co-operating housings.
Figure 3:
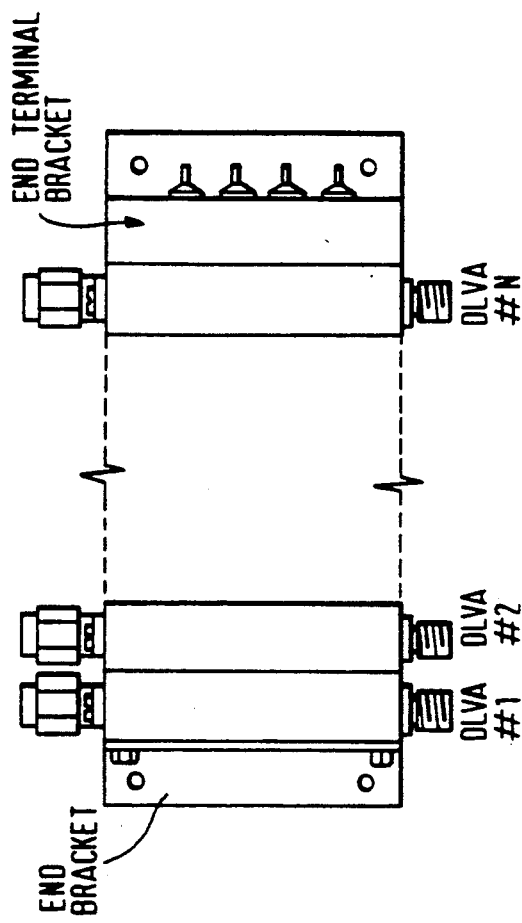
FIG. 3 shows a housing for the circuit of FIG. 1.

FIG. 3 of the accompanying drawings shows the external housing for the circuit shown in FIG. 1. The housing or unit includes a plurality of pins 40 positioned on one side thereof and similarly placed sockets (not shown) on the opposite side thereof. As shown in FIG. 4 of the accompanying drawings the pins and sockets are positioned to enable the pins 40 from one unit to engage with sockets in another unit thereby enabling a plurality of units to be coupled together. The units can therefore be arranged to receive: power (+V, 0, −V) from a common power supply 28; a common reference signal; a common clock signal; and a common path for the serial data over link 27. In the preferred embodiment, up to 16 units may be connected together with each unit being identified by a unique address. This allows a host computer to supply operational data to each amplifier circuit via its respective processor 24.

Reference signals are supplied to comparator 19 which are in turn arranged to produce an output when the input level exceeds a predetermined threshold. The output from comparator 19 may be supplied to a DC restore circuit 29 and circuitry may also be provided for receiving a biased input on a line 30. The detector 15 preferably includes a tunnel diode and, in addition to an input being supplied on line 31, a reference ground is also supplied on a line 32.

Having thus described the present invention by reference to a preferred embodiment it is to be well understood that the embodiment in question is exemplary only and that modifications and variations such as will occur to those possessed of appropriate knowledge and skills may be made without departure from the spirit and scope of the invention as set forth in the appended claims and equivalents thereof.

I claim:

1. An amplification circuit comprising:

detecting means having an input to which transmitted radio signals are applied for detecting radio signals having a frequency in the range of 0.5 GHz to 20 GHz, and for outputting said detected signals;

a wideband amplifier connected to said detecting means for effecting an amplifying operation to said detected signals, said wideband amplifier being a multi-stage amplifier, each stage having plural amplifying operation characteristics, each characteristic being adjustable in response to one of a plurality of control signals, the amplifier being fabricated on a first common integrated circuit; and temperature compensation means coupled to said amplifier for compensating for temperature related changes in the amplifying operation of said amplifier, said temperature compensation means including:

a temperature sensor for producing a temperature signal indicative of the temperature of said amplifier, said temperature sensor also being fabricated on said first common integrated circuit;

sampling means connected to said temperature sensor for sampling said temperature signal;

storing means for storing compensation parameters; and processing means connected to said sampling means and said storing means for processing said temperature signal and said compensation parameters to produce said plurality of control signals and supplying said control signals to said amplifier, thereby to compensate for temperature related changes such that the amplifying operation of said amplifier remains constant.

2. An amplification circuit according to claim 1, wherein said wideband amplifier and said temperature sensor are fabricated on said first common integrated circuit using bipolar technology.

3. An amplification circuit according to claim 1, wherein said sampling means and said processing means are both fabricated on a second common integrated circuit.

4. An amplification circuit according to claim 3, wherein said processing means produces said control signals in digital form and said second common integrated circuit also includes output means for converting said digital control signals into analog control signals for said first integrated circuit.

5. An amplification circuit according to claim 3, wherein said second common integrated circuit is fabricated using CMOS technology.

6. An amplification circuit according to claim 1, wherein said wideband amplifier is a multi-stage logarithmic amplifier.

7. An amplification circuit according to claim 6, wherein each stage of said multi-stage logarithmic amplifier has adjustable gain, offset and weighting current and said gain, offset and weighting current of said amplifier stages are adjusted by said control signals.

8. An amplification circuit according to claim 4, wherein said second common integrated circuit is fabricated using CMOS technology.

* * * * *